United States Patent [19]
Shironouchi

[11] Patent Number: 6,086,641
[45] Date of Patent: *Jul. 11, 2000

[54] DIE BONDER FOR A SEMICONDUCTOR PRODUCING APPARATUS

[75] Inventor: Toshiaki Shironouchi, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/802,291

[22] Filed: Feb. 18, 1997

[30] Foreign Application Priority Data

Feb. 20, 1996 [JP] Japan .................................. 8-032426

[51] Int. Cl.[7] ............................. H01L 21/00; H01L 21/64
[52] U.S. Cl. ............................................. 29/25.01; 29/740
[58] Field of Search .................................. 29/25.01, 740; 437/206, 212, 247

[56] References Cited

U.S. PATENT DOCUMENTS

| 3,668,044 | 6/1972 | Wiesler et al. | 156/366 |
| 5,009,590 | 4/1991 | Mitarai et al. | 432/121 |

FOREIGN PATENT DOCUMENTS

| 64-41229 | 2/1989 | Japan . |
| 5291488 | 5/1993 | Japan . |
| 9-64073 | 3/1997 | Japan . |
| 9-97805 | 4/1997 | Japan . |

OTHER PUBLICATIONS

Technical Report of Hitachi Tokyo Electronics Co., Ltd., No. 12, pp. 20–21, date not avail.
Technical Report of Hitachi Tokyo Electronics Co., Ltd., No. 7, pp. 12–16, date not avail.
Catalog No. LM100 92–01 of Hitachi Tokyo Electronics Co., Ltd. (2 pp.), date not avail.
"LOC Assembly Techniques and Apparatus Outline"; Hitachi Tokyo Electronics Co., Ltd., (20 pp.), date not avail.
Japanese Office Action dated May 19, 1998 with English language translation of Japanese Examiner's comments.

*Primary Examiner*—David E. Graybill
*Attorney, Agent, or Firm*—Whitham, Curtis & Whitham

[57] ABSTRACT

A die bonder for a semiconductor producing apparatus is disclosed. The die bonder is capable of dealing with packages having a standard structure and packages having an LOC (Lead On Chip) structure, as needed.

6 Claims, 6 Drawing Sheets

DIE BONDER FOR A SEMICONDUCTOR PRODUCING APPARATUS

BACKGROUND OF THE INVENTION

The present invention relates to a semiconductor producing apparatus and, more particularly, to a die bonder for bonding a semiconductor device (referred to as pellet hereinafter) to the top or the bottom of a lead frame by paste-like adhesive or organic resin adhesive.

Semiconductor devices sealed with resin have either one of two different structures. One of the structures is a standard structure traditional with semiconductor devices of the kind described. The other structure is an LOC (Lead On Chip) structure recently introduced into the semiconductor art in order to reduce the thickness and size of a package for a high integration memory or similar large size pellet. Die bonding methods assigned to the standard structure and LOC structure, respectively, have customarily been implemented by two exclusive types of die bonders. The two types of die bonders are selectively used, depending on the application.

However, the proportion of one of the two different types of semiconductor devices to the other as to the quantity of production varies with the trend of market, generation, etc. Therefore, the two types of die bonders must each be installed in a number great enough to produce the estimated maximum number of semiconductor devices. Assume that the quantity of production of packages having one of the two different structures is reduced due to a drastic change in the proportion. Then, the production ability available with the die bonders assigned to such packages becomes excessive, lowering the efficiency of facility investment.

Technologies relating to the present invention are disclosed in, e.g., Japanese Patent Laid-Open Publication No. 5-291488, TECHNICAL REPORT of Hitachi Tokyo Electronics Co., Ltd, No. 12, pages 20–21 and No. 7, pages 12–16, catalog No. LM100 92-01 of Hitachi Tokyo Electronics Co., Ltd, and "LOC ASSEMBLY TECHNIQUES AND APPARATUS OUTLINE" of Hitachi Tokyo Electronics Co., Ltd.

SUMMARY OF THE INVENTION

It is therefore an object of the present invention to provide a die bonder for a semiconductor producing apparatus and capable of dealing with both of packages having the standard structure and packages having the LOC structure.

A die bonder of the present invention is of the type picking up a pellet from a semiconductor wafer undergone dicing, and bonding the pellet to a lead frame by one of paste-like adhesive and organic resin adhesive. The lead frame is one of a first lead frame having a pellet mounting portion to which the pellet is bonded after the paste-like adhesive has been applied to the pellet mounting portion, and a second lead frame having a pellet mounting portion to which the pellet is bonded after the organic resin adhesive applied beforehand to an insulating material positioned on the pellet mounting portion has been melted by heat. The die bonder includes a conveying mechanism for conveying on a pitch basis any one of the first and second lead frames by supporting both side edges of the lead frame outside of the pellet mounting portion. The first lead frame is conveyed with its pellet mounting portion facing upward while the second lead frame is conveyed with its pellet mounting portion facing downward. An applying mechanism applies the paste-like adhesive to the pellet mounting portion of the first lead frame being conveyed by the conveying means. A compression stage positiones the pellet transferred thereto relative to the pellet mounting portion, then heats the pellet, then shifts the pellet to beneath the pellet mounting portion facing downward, and then applies the pellet to the pellet mounting portion. A first transferring mechanism picks up a pellet from the semiconductor wafer positioned on a wafer stage, and then transfers the pellet to the compression stage. A second transferring mechanism transfers the pellet positioned on the compression stage, but not heated, onto the pellet mounting portion facing upward. A compressing mechanism compresses the lead frame and pellet in cooperation with the compression stage to thereby bond the lead frame and pellet.

BRIEF DESCRIPTION OF THE DRAWINGS

The above and other objects, features and advantages of the present invention will become apparent from the following detailed description taken with the accompanying drawings in which.

In the drawings, identical reference numerals denote identical structural elements.

DESCRIPTION OF THE PREFERRED EMBODIMENTS

Figure 1:
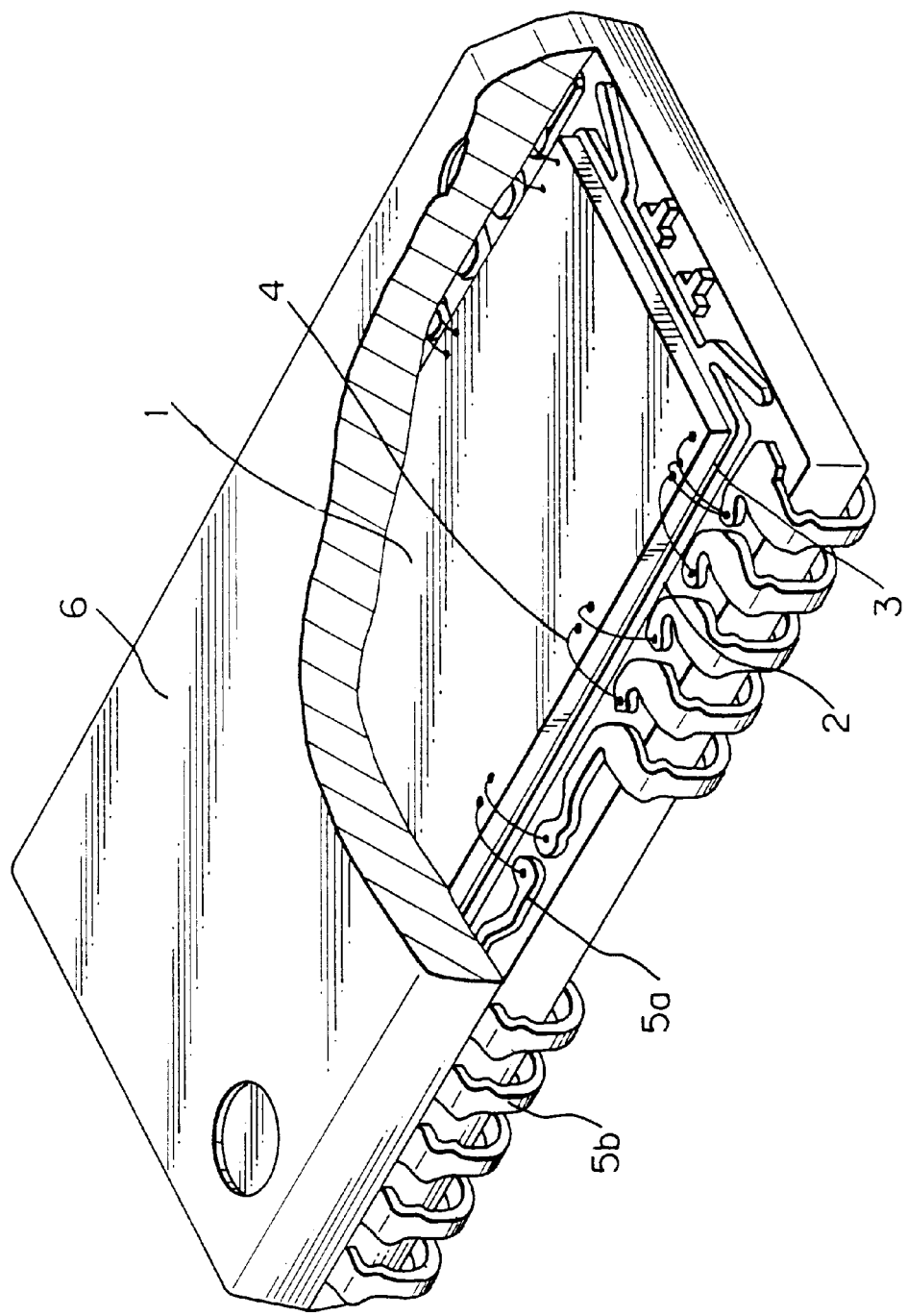
FIGS. 1 and 2 are perspective views respectively showing a conventional package having the standard structure and a conventional package having the LOC structure.

To better understand the present invention, the two different types of semiconductor packages will be described specifically. FIG. 1 shows a package having the previously stated standard structure. As shown, a pellet 1 is accurately positioned on Ag paste or similar adhesive 3 applied to a pellet mounting portion or island 2. Then, the assembly is heated in order to harden the Ag paste 3. As a result, the pellet 1 is fully affixed to the island 2. After such die bonding, electrodes provided on the pellet 1 and inner leads 5a are connected together by wire bonding using thin metal wires 4. Finally, a resin seal 6 and outer leads 5b are molded to complete the package.

Figure 2:
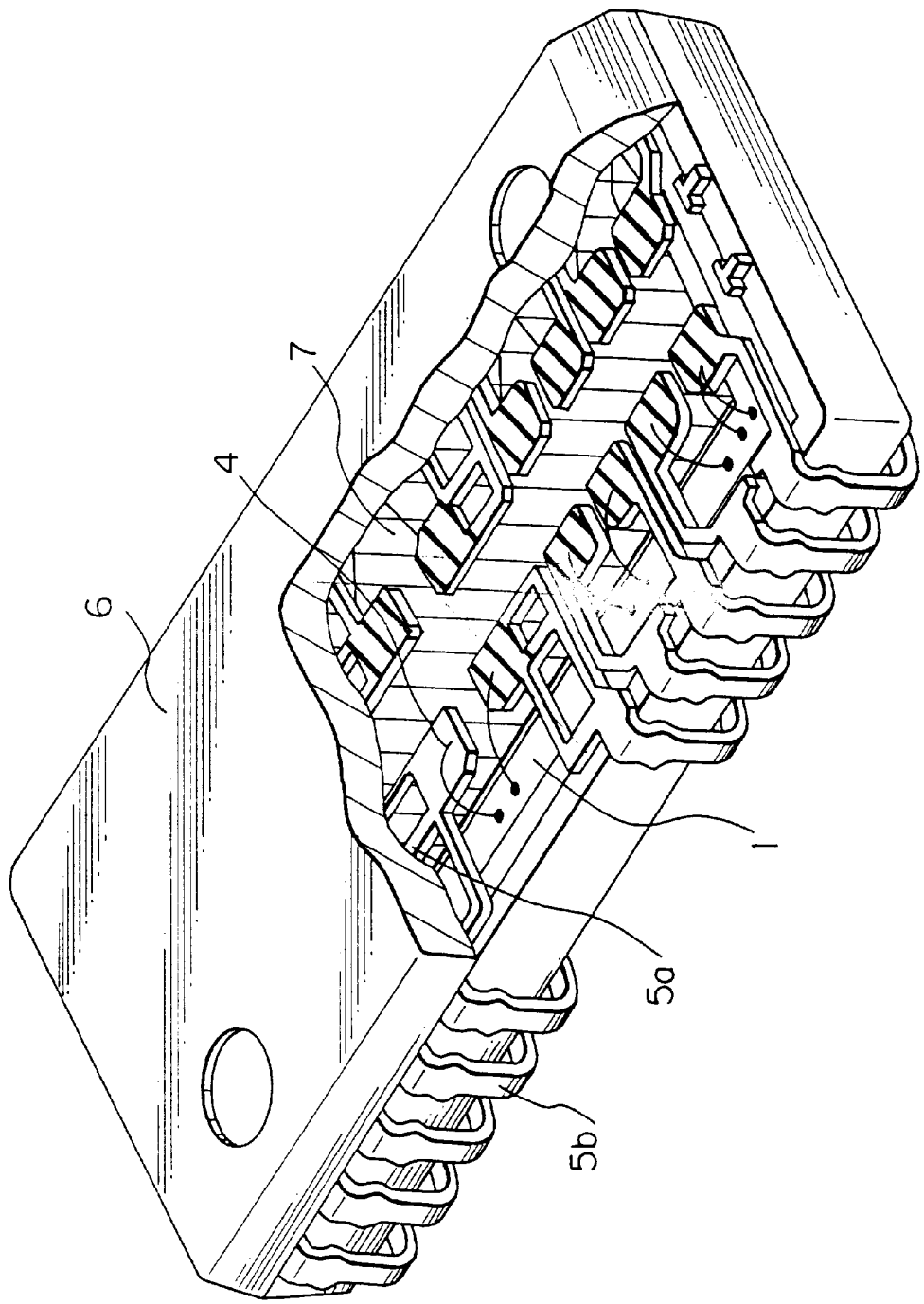

FIG. 2 shows a package having the LOC structure also stated previously. As shown, an insulating tape 7 is adhered to the underside of the inner leads 5a beforehand. The insulating tape 7 carries adhesive made of organic resin on both sides thereof. The pellet 1 accurately positioned is affixed to the underside of the tape 7 by thermocompression. As a result, the pellet 1 is affixed to the underside of a lead frame by die bonding. This is also followed by the molding of the resin seal 6 and outer leads 5b.

As stated above, a particular die bonding scheme is assigned to each package having a particular structure and using particular adhesive. Therefore, two different die bonders entirely different in construction are needed and must be selectively used.

Figure 3:
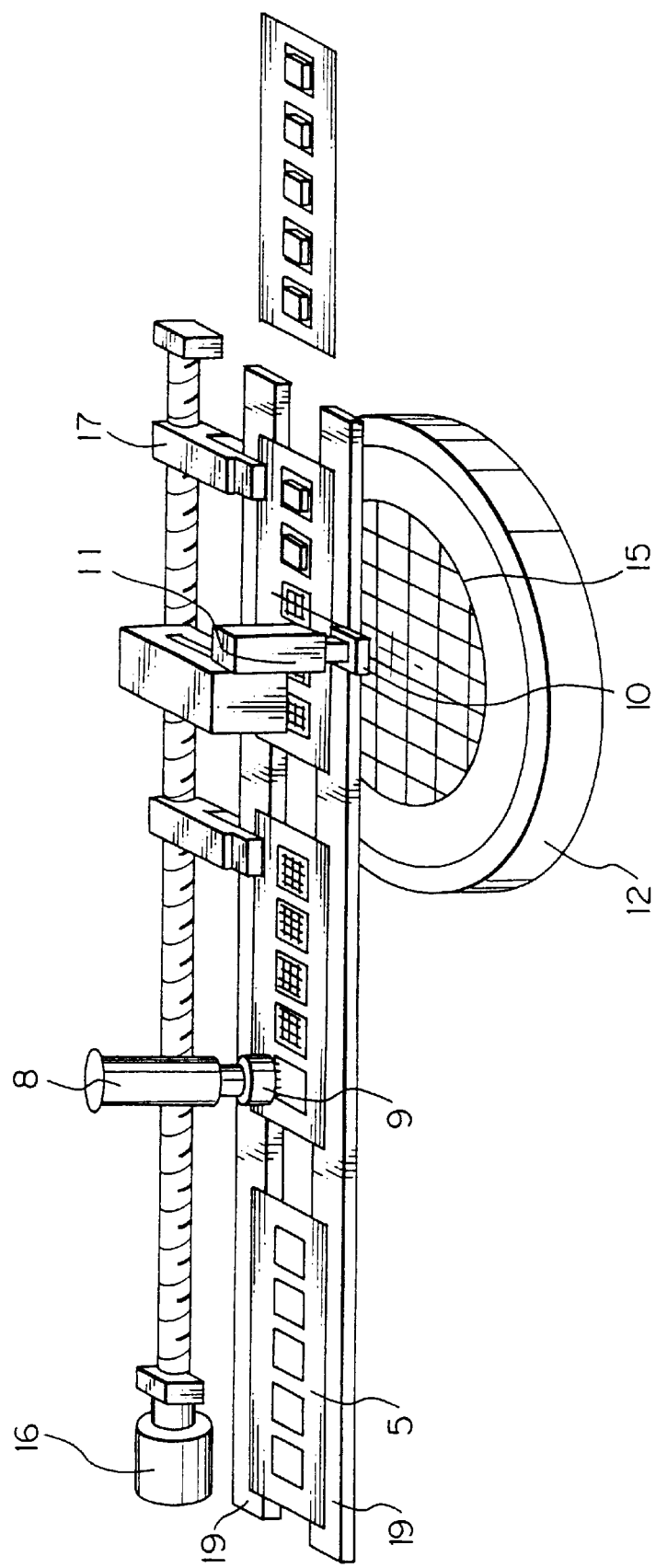
FIGS. 3 and 4 are perspective views respectively showing die bonders assigned to the packages having the standard structure and LOC structure.

Reference will be made to FIG. 3 for describing the construction and operation of a conventional die bonder for packages having the standard structure. As shown, lead frames 5 are sequentially laid on feeder rails 19 and conveyed from the left to the right, as viewed in FIG. 3, by being gripped by feed grippers 17. While each lead frame 5 is in conveyance, the application of the paste-like adhesive and die bonding are effected. The paste-like adhesive is fed from a syringe-like container 8 via a nozzle 9 while being controlled in shape, size and amount in conformity to the configuration of the pellet mounting portion of each lead frame 5. A wafer 15 undergone dicing is laid on a wafer stage 12. A collet 10 mounted on the end of a pellet transfer head 11 sequentially picks up the pellets 1 from the wafer 15 and positions them on the pellet mounting portions of the lead frames 5. This is followed by die bonding. Also shown in FIG. 3 is a motor 16.

Figure 4:
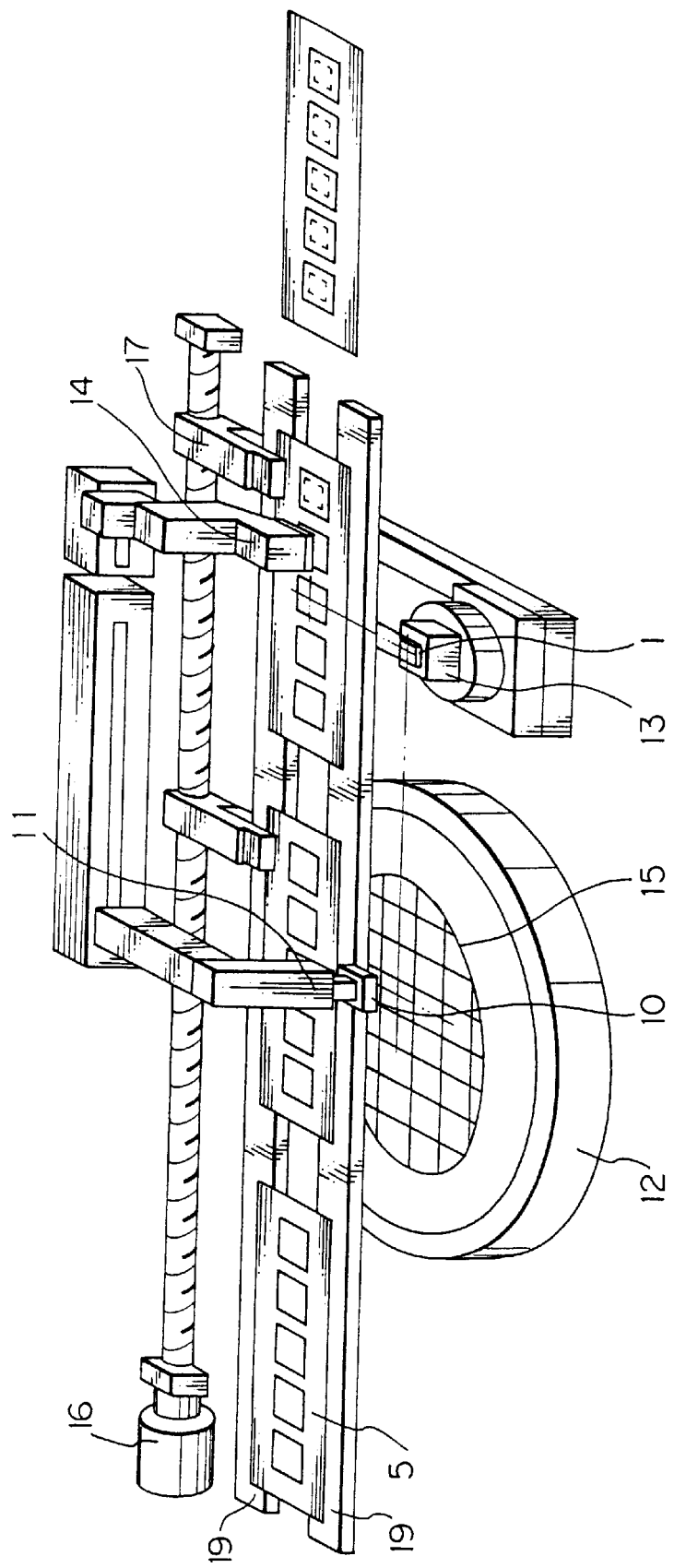

FIG. 4 shows a die bonder for packages having the LOC structure. As shown, each lead frame 5 is conveyed along the feeder rails 19 from the left to the right, as viewed in FIG. 4, by being gripped by the feed grippers 17, as in the apparatus shown in FIG. 3. The collet 10 picks up the pellet 1 from the wafer 15 laid on the wafer stage 12 and puts it on a compression stage 13 which is heated to about 200° C. Then, the position of the pellet 1 on the compression stage 13 is detected and corrected. At the same time, the stage 13 is moved to the rear until it faces the underside of the lead frame 5. Compression head 14 is also moved to a position where it faces the stage 13. In this condition, the stage 13 and head 14 nip and compress the lead frame 5 and pellet 1 in order to connect them together by thermo-compression.

The conventional die bonder assigned to the standard structure lacks a die bonding mechanism for connecting the pellet 1 and lead frame 5 by thermo-compression. This kind of die bonder cannot perform bonding with packages having the LOC structure. On the other hand, the die bonder assigned to the LOC structure lacks the mechanism for applying the paste-like adhesive and the pellet transfer head 11 for placing the pellet 1 on the lead frame 5. The die bonder of this kind cannot perform bonding with packages having the standard structure. Under these circumstances, the problems discussed earlier are brought about.

Figure 5:
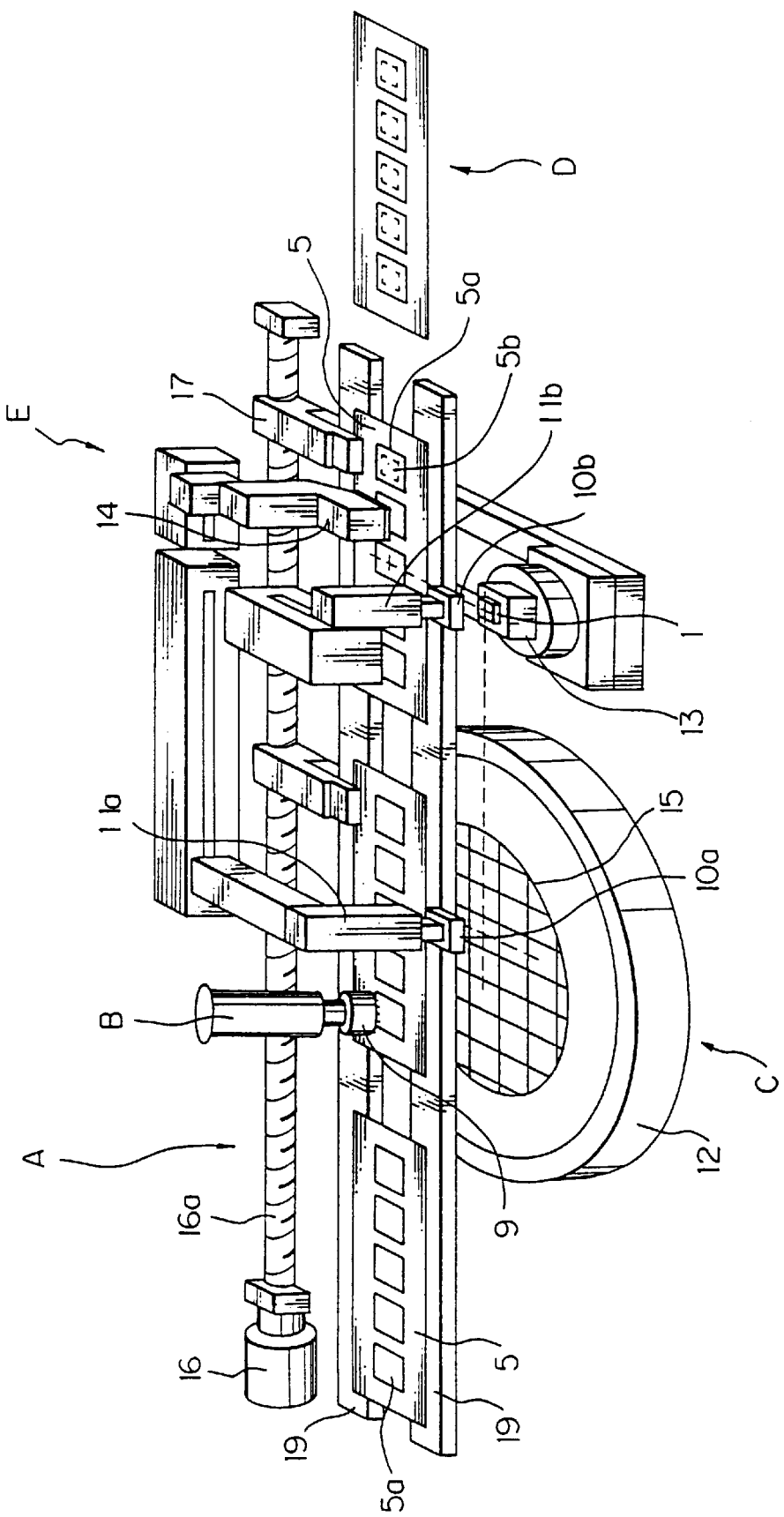
FIG. 5 is a perspective view showing a die bonder embodying the present invention.

Referring to FIG. 5, a die bonder in accordance with the present invention is basically made up of a lead frame conveying mechanism A, an adhesive applying mechanism B, a first pellet transferring mechanism C, a compression stage 13, a second pellet transferring mechanism D, and a compressing mechanism E. Briefly, with these mechanisms A–E, the die bonder picks up a pellet 1 from a wafer 15 undergone dicing and bonds it by organic resin adhesive to a pellet mounting portion 5a included in a lead frame 5 and positioned face up or face down.

The above die bonder is selectively operable with a first and a second type of lead frame 5. As for the first type of lead frame 5, the paste-like adhesive is applied to the pellet mounting portion 5a, and then the pellet 1 is bonded to the portion 5a. As for the second type of lead frame 5, an insulating tape 5b is adhered to the pellet mounting portion 5a beforehand, and carries organic resin adhesive on both sides thereof. The adhesive of the tape 5b is melted by heat in order to bond the pellet 1 to the lead frame 5.

The lead frame conveying mechanism A conveys the lead frames 5 on a pitch basis while supporting both side edges of the lead frames 5 outside of the pellet mounting portions 5a. The first type of lead frames 5 and the second type of lead frames 5 are conveyed with their pellet mounting portions 5a facing upward and downward, respectively.

The adhesive applying mechanism B applies the adhesive to the pellet mounting portion 5a of the first type of lead frame 5 being conveyed on a pitch basis. The first pellet transferring mechanism C picks up one pellet 1 from the wafer 15 at a time with a first collect 10a and transfers it onto the compression stage 13.

The compression stage 13 has a function of positioning the pellet 1 relative to the pellet mounting portion 5a, and a function of heating the positioned pellet 1, shifting the pellet 1 to beneath the portion 5a facing downward, and applying the former to the latter. The second pellet transferring mechanism D transfers the pellet 1 positioned on the compression stage 13, but not heated, onto the pellet mounting portion 5a facing upward. The compressing mechanism E grips the lead frame 5 and pellet 1 between it and the compression stage 13 and compresses them.

A die bonder embodying the present invention and having the above basic construction will be described specifically with reference to FIG. 5. As shown, the lead frame conveying mechanism A includes two feeder rails 19 for supporting both side edges of the lead frame 5. The pellet mounting portion 5a of the lead frame 5 is positioned between the feeder rails 19. Each feed gripper 17 grips one side edge of the lead frame 5 and is driven by a motor 16 via a threaded rod 16a in order to convey the lead from 5 from the left to the right, as viewed in FIG. 5.

The adhesive applying mechanism B, first pellet transferring mechanism C, second pellet transferring mechanism D and compressing mechanism E are sequentially arranged in this order along the direction in which the conveying mechanism A conveys the lead frame 5. The mechanism B has a container 8 containing the paste-like adhesive and a nozzle 9. The mechanism C has a first pellet transfer head 11a and the compression stage 13. The mechanism D has a second pellet transfer head 11b while the mechanism E has a compression head 14. The container 8 is filled with the paste-like adhesive and causes it to drop via the nozzle 9 onto the pellet mounting portion 5a of the lead frame facing upward. The first pellet transfer head 11a picks up by suction one pellet 1 from the wafer 15 laid on the wafer stage 12, and transfers it onto the compression stage 13.

The compression stage 13 is movable in a reciprocating motion between a position where the first pellet transfer head 11a brings the pellet 1 to the stage 13 and a position beneath the lead frame 5, performing the functions stated earlier. To position the pellet 1, the illustrative embodiment uses a general-purpose technology which detects the position of the pellet 1 in the form of an image and then executes preselected processing.

The compression head 14 nips the lead frame 5 and pellet 1 between it and the compression stage 13 and compresses them.

In operation, the lead frame 5 is laid on the feeder rails 19 and conveyed by the feed gripper 17 from the left to the right, as viewed in FIG. 5. Assume that the lead frame is to implement a standard type package. Then, the lead frame 5 is conveyed with its pellet mounting portion 5a facing upward, until the lead frame 5 reaches a position beneath the nozzle 9. In this position, the adhesive is applied from the nozzle 9 to the portion 5a of the lead frame 5. On the other hand, the pellet transfer head 11a picks up one pellet 1 from the wafer 15 with its collet 10a and then puts it on the compression stage 13. Subsequently, the other pellet transfer head 11b picks up the pellet 1 from the compression stage 13 with its collet 10b and then puts it on the portion 5a of the lead frame 5 to which the adhesive has been applied. As a result, the pellet 1 is adhered to the portion 5a.

When the lead frame 5 is to implement an LOC type package, it is conveyed with its pellet mounting portion 5a facing downward. The organic resin adhesive applied to the insulating tape 5b beforehand is melted by heat, so that the pellet 1 is bonded to the pellet mounting portion 5a. Specifically, the pellet transfer head 11a picks up one pellet 1 from the wafer 15 with its collect 10a and then puts it on the compression stage 13 which is heated to about 200° C. Subsequently, the stage 13 detects the position of the pellet 1 laid thereon, corrects the position of the pellet 1 in directions X, Y and θ on the basis of a detected dislocation, and then moves the pellet 1 to beneath the portion 5a of the lead frame 5. At the same time, the compression head 14 is moved to a position where it faces the stage 13. The stage 13 and head 14 facing each other cooperate to nip and compress the lead frame 5 and pellet 1 for about 1 second with a load of about 1 kg to about 1.5 kg. Consequently, the adhesive of the insulating tape 5b melts and bonds the pellet 1 to the portion 5a of the lead frame 5.

Figure 6:
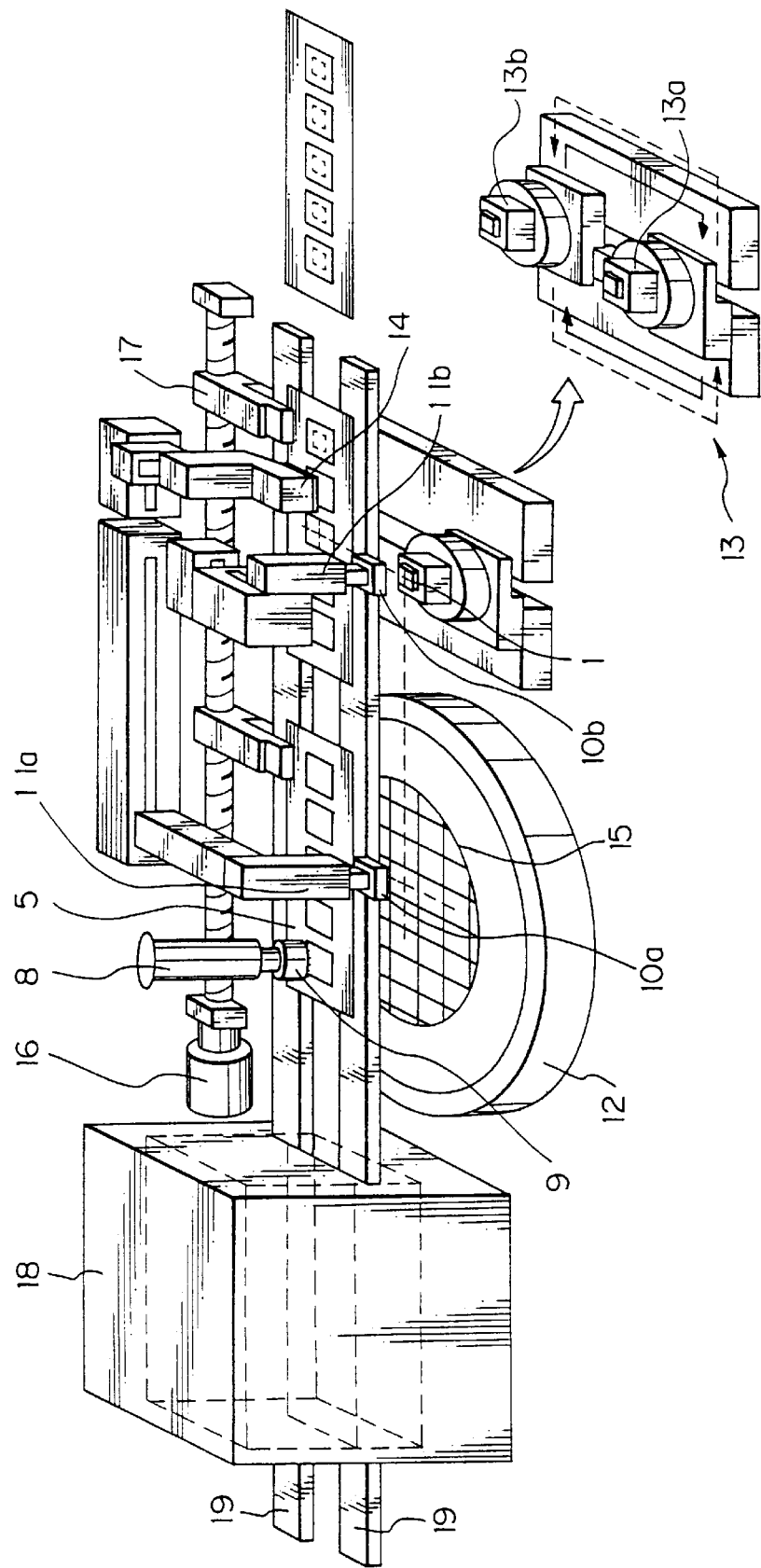
FIG. 6 is a perspective view showing an alternative embodiment of the present invention.

Referring to FIG. 6, an alternative embodiment of the present invention will be described. This embodiment is essentially similar to the previous embodiment except for the following. As shown, the leading end portions of the feeder rails 19 with respect to the direction of conveyance extend throughout a prebaking chamber 18. The prebaking chambers 18 preheats the lead frame 5 for an LOC type package in order to dehydrate the adhesive. Specifically, assume that the organic resin adhesive used to bond the pellet 1 for an LOC type package to the lead frame 5 is heated without being dehydrated. Then, bubbles are apt to appear in the adhesive layer and lower the quality of the package, depending on the kind, characteristic and so forth of the adhesive. The prebaking chamber 18 allows the die bonder to deal with a broader range of LOC type packages.

Further, as shown in FIG. 6, the alternative embodiment includes a first and a second compression stage 13a and 13b. While the second or rear stage 13b and compression head 14 perform die bonding, the first or front stage 13a allows the pellet 1 to be positioned thereon. After the stage 13b has ended bonding, the two stages 13a and 13b are replaced with each other. Subsequently, the stages 13a and 13b repeat the above operation with the lead frame 5 being conveyed on a pitch basis. This kind of parallel processing reduces the die bonding cycle time and thereby enhances productivity.

In summary, it will be seen that the present invention provides a die bonder having various unprecedented advantages, as enumerated below.

(1) The die bonder is operable with both of past-like adhesive and organic resin adhesive. Therefore, the die bonder can readily deal with both of standard type packages and LOC type packages.

(2) Lead frames for the standard application and those for the LOC application are both conveyed by two feeder rails in a horizontal position although the pellet mounting portions of the former and those of the latter face upward and downward, respectively. Specifically, each lead frame has its opposite side edges outside of the pellet mounting portion supported by the feeder rails and is conveyed on a pitch basis. Such a configuration allows two die bonding mechanisms respectively using the paste-like adhesive and organic resin adhesive to be arranged above and below the lead frame being conveyed in the horizontal position. As a result, two different package structures can be dealt with only if the orientation of the pellet mounting portion of the lead frame is changed.

(3) Even when the proportion of one of the two different types of packages to the other as to the quantity of production is varied, the die bonder can deal with them easily. This enhances the efficient use of the die bonder and minimizes the number of die bonders to be installed, the space for accommodating them, etc.

Various modifications will become possible for those skilled in the art after receiving the teachings of the present disclosure without departing from the scope thereof.

What is claimed is:

1. A die bonder for picking up a pellet from a semiconductor wafer during a dicing process, and bonding said pellet to one of a first lead frame with a paste adhesive and a second lead frame with an organic resin adhesive, said first lead frame having a first pellet mounting portion to which said pellet is bonded after said paste adhesive has been applied to said first pellet mounting portion, said second lead frame having a second pellet mounting portion to which said pellet is bonded after said organic resin adhesive is melted to an insulating material positioned on said second pellet mounting portion, said die bonder comprising:

a conveying means for conveying on a pitch any one of said first lead frame and second lead frame, wherein said first lead frame is conveyed with said first pellet mounting portion facing upward while said second lead frame is conveyed with said second pellet mounting portion facing downward;

an applying means for applying said paste adhesive to said first pellet mounting portion of said first lead frame being conveyed by said conveying mechanism;

a stage means, comprising a first stage and a second stage for alternately positioning said pellet relative to said second pellet mounting portion, heating said pellet, shifting said pellet to beneath said second pellet mounting portion facing downward, and applying said pellet to said second pellet mounting portion;

a first transferring means for picking up said pellet from the semiconductor wafer positioned on a wafer stage, and transferring said pellet to said stage means;

a second transferring means for transferring said pellet positioned on said compression stage onto said first pellet mounting portion facing upward; and a compressing means for compressing said second lead frame with said pellet in cooperation with said compression stage to thereby bond said pellet to said second lead frame.

2. A die bonder as claimed in claim 1, wherein said conveying means comprises a pair of feeder rails for supporting side edges of said first lead frame and second lead frame such that said first and second pellet mounting portions are positioned between said pair of feeder rails.

3. A die bonder as recited in claim 1, further comprising a prebaking chamber for preheating said second-type lead frame being conveyed by said conveying mechanism.

4. A die bonder compression mechanism for bonding a pellet to a lead frame in reduced bonding cycle time, comprising:

a rotatable platform having a first end and a second end;

a first compression stage positioned at said first end of said platform;

a second compression stage positioned at said second end of said platform; and a compression head, wherein when said platform is in a first position said first compression stage is positioned under said compression head and said second compression stage is positioned to receive a pellet and when said platform is in a second position said second compression stage is positioned under said compression head and said first compression stage is positioned to receive a pellet.

5. A die bonder compression mechanism as recited in claim 4 wherein said first compression stage and said second compression stage are heated.

6. A die bonder compression mechanism as recited in claim 4 wherein said first compression stage and said second compression stage attain a temperature of at least 200° C.

* * * * *